(12) United States Patent
Inoue et al.

(10) Patent No.: US 12,397,574 B2
(45) Date of Patent: Aug. 26, 2025

(54) FLEXOGRAPHIC PRINTING ORIGINAL PLATE

(71) Applicant: Sumitomo Riko Company Limited, Aichi (JP)

(72) Inventors: Daisuke Inoue, Aichi (JP); Yutaro Yamada, Aichi (JP); Hideyuki Hashimoto, Aichi (JP)

(73) Assignee: Sumitomo Riko Company Limited, Aichi (JP)

( * ) Notice: Subject to any disclaimer, the term of this patent is extended or adjusted under 35 U.S.C. 154(b) by 0 days.

(21) Appl. No.: 18/297,660

(22) Filed: Apr. 10, 2023

(65) Prior Publication Data

US 2023/0241909 A1   Aug. 3, 2023

Related U.S. Application Data

(63) Continuation of application No. PCT/JP2021/047523, filed on Dec. 22, 2021.

(30) Foreign Application Priority Data

Dec. 23, 2020 (JP) .................................. 2020-213967

(51) Int. Cl.
*B41N 1/12* (2006.01)
*B41F 5/24* (2006.01)
(Continued)

(52) U.S. Cl.
CPC .................. *B41N 1/12* (2013.01); *B41F 5/24* (2013.01); *G03F 7/033* (2013.01); *G03F 7/2012* (2013.01)

(58) Field of Classification Search
None
See application file for complete search history.

(56) References Cited

U.S. PATENT DOCUMENTS

| | | | |
|---|---|---|---|
| 2006/0257788 A1 | 11/2006 | Matsumoto et al. | |
| 2009/0053542 A1* | 2/2009 | Kuwata | B32B 27/08 |
| | | | 428/689 |

(Continued)

FOREIGN PATENT DOCUMENTS

| | | | | |
|---|---|---|---|---|
| JP | 2002299884 A | * | 10/2002 | ............. A63G 31/12 |
| WO | 2004104701 | | 12/2004 | |
| WO | WO-2019130784 A1 | * | 7/2019 | ............... B41N 1/00 |

OTHER PUBLICATIONS

"International Search Report (Form PCT/ISA/210) of PCT/JP2021/047523", mailed on Mar. 8, 2022, with English translation thereof, pp. 1-4.

(Continued)

*Primary Examiner* — Joshua D Zimmerman
(74) *Attorney, Agent, or Firm* — JCIPRNET (57) ABSTRACT

The disclosure provides a flexographic printing original plate which comprises an adhesive layer that exhibits excellent solvent resistance and excellent adhesion to a supporting body. The disclosure provides a flexographic printing original plate 10 which sequentially comprises, on a surface of a supporting body 12, an elastic layer 16 and an adhesive layer 14, wherein the supporting body 12 contains a polyester resin and the adhesive layer 14 contains the components (a), (b) and (c) described below. (a) a polyester resin (b) an isocyanate compound (c) a xylene resin which has a melting point or softening point of 100° C. or less.

4 Claims, 2 Drawing Sheets

(51) Int. Cl.
G03F 7/033 (2006.01)
G03F 7/20 (2006.01)

(56) References Cited

U.S. PATENT DOCUMENTS

2020/0241416 A1* 7/2020 Morihara ................ G03F 7/033
2022/0282023 A1* 9/2022 Hariu ..................... C08G 63/54

OTHER PUBLICATIONS

"Search Report of Europe Counterpart Application", issued on Mar. 1, 2024, p. 1-p. 9.
"Office Action of Europe Counterpart Application", issued on Oct. 24, 2024, pp. 1-8.

* cited by examiner

FLEXOGRAPHIC PRINTING ORIGINAL PLATE

CROSS-REFERENCE TO RELATED APPLICATION

The present application is a continuation of PCT/JP2021/047523, filed on Dec. 22, 2021, and is related to and claims priority from Japanese Patent Application No. 2020-213967, filed on Dec. 23, 2020. The entire contents of the aforementioned application are hereby incorporated by reference herein.

TECHNICAL FIELD

The disclosure relates to a flexographic printing original plate.

RELATED ART

Conventionally, printing plates have been used to perform letterpress printing, intaglio printing, or lithographic printing on printing materials such as packaging materials, labels, and magazines. Among these, letterpress printing is performed using a letterpress. The letterpress has a flexographic printing plate that can be applied to a variety of printing materials because the material is soft. The original plate of the flexographic printing plate generally includes a photosensitive resin layer composed of a photosensitive resin composition, on a supporting body composed of a polyester film or the like via an adhesive layer.

The flexographic printing plate with a relief image formed on the photosensitive resin layer of the flexographic printing original plate is fixed to a plate cylinder of a printing machine with double-sided tape or the like to be used for printing, and then peeled off from the plate cylinder for reuse. Since a large force is applied to the supporting body and the photosensitive resin layer when the flexographic printing plate is peeled off from the plate cylinder, the photosensitive resin layer may be peeled off from the supporting body. If the photosensitive resin layer is peeled off from the supporting body, it becomes difficult to reuse the flexographic printing plate. Therefore, the adhesive layer constituting the flexographic printing plate is required to have a sufficient adhesive force. Besides, the flexographic printing plate is in contact with the ink during printing, and the solvent contained in the ink may permeate not only the photosensitive resin layer but also the adhesive layer, and reduce the adhesive force of the adhesive layer. Therefore, the adhesive layer constituting the flexographic printing plate is required to have high solvent resistance so as to maintain a sufficient adhesive force even when in contact with the ink solvent.

As an adhesive layer exhibiting high adhesion and high solvent resistance in the flexographic printing original plate, for example, the following Patent Literature 1 (International Publication No. 2004/104701) discloses an adhesive layer that contains a certain thermoplastic elastomer, at least one type of ethylenically unsaturated compound, and at least one type of polymerization initiator. The above ethylenically unsaturated compound contains at least one type of (meth) acrylate having one or more aromatic rings and/or one or more hydroxyl groups in the molecule.

As described above, in order to avoid separation between the supporting body and the photosensitive resin layer when the flexographic printing plate is peeled off from the plate cylinder, the adhesive layer constituting the flexographic printing original plate is required to have high adhesion and high solvent resistance to maintain the adhesion even when in contact with ink. Although the adhesive layer containing a thermoplastic elastomer and an acrylate compound, such as the one disclosed in Patent Literature 1, has compositional similarity with the photosensitive resin layer and thus exhibits high adhesion to the photosensitive resin layer, it is difficult to exhibit sufficiently high adhesion to the supporting body. Therefore, when the flexographic printing plate is peeled off from the plate cylinder, the supporting body and the adhesive layer may be separated from each other, and solvent-induced adhesion loss may occur between the supporting body and the adhesive layer in an environment of contacting ink.

SUMMARY

The disclosure provides a flexographic printing original plate having an adhesive layer with excellent adhesion to a supporting body and excellent solvent resistance.

A flexographic printing original plate according to an embodiment of the disclosure sequentially has a photosensitive resin layer and an adhesive layer on a surface of a supporting body. The supporting body contains a polyester resin, and the adhesive layer contains the following components (a), (b), and (c).

(a) a polyester resin
(b) an isocyanate compound
(c) a xylene-based resin having a melting point or softening point of 100° C. or less Here, the xylene-based resin of the component (c) preferably has a hydroxyl group. In this case, the xylene-based resin of the component (c) preferably has a hydroxyl group at a terminal of a skeleton composed of a condensate of m-xylene and formaldehyde. The xylene-based resin of the component (c) preferably does not have a phenolic hydroxyl group.

The adhesive layer preferably contains 10 parts by mass or more and 30 parts by mass or less of the component (c) with respect to 100 parts by mass of the component (a). The polyester resin of the component (a) preferably has a glass transition temperature of 20° C. or less. The isocyanate compound of the component (b) preferably contains three or more isocyanate groups per molecule. The adhesive layer preferably has a thickness of 10 μm or more. The photosensitive resin layer preferably contains a water-dispersed latex. The isocyanate compound of the component (b) preferably has an isocyanurate skeleton.

In the flexographic printing original plate according to the disclosure, the adhesive layer contains the xylene-based resin of the component (c) that functions as a tackifier, so as to exhibit high adhesion to the supporting body containing the photosensitive resin layer and the polyester resin. In addition, the adhesive layer has high solvent resistance and can maintain high adhesion even when in contact with the solvent contained in the ink.

Here, when the xylene-based resin of the component (c) has a hydroxyl group, particularly, when the xylene-based resin has a hydroxyl group at the terminal of the skeleton composed of the condensate of m-xylene and formaldehyde, the solvent resistance of the adhesive layer is particularly high. It is considered that the xylene-based resin of the component (c) causes a crosslinking reaction with the isocyanate compound of the component (b). However, since the phenolic hydroxyl group does not exhibit a high effect in improving the solvent resistance of the adhesive layer, it is preferable that the xylene-based resin of the component (c) does not have a phenolic hydroxyl group.

When the adhesive layer contains 10 parts by mass or more and 30 parts by mass or less of the component (c) with respect to 100 parts by mass of the component (a), in the adhesive layer, the effect of improving the adhesion and solvent resistance contributed by the component (c) can be obtained.

When the polyester resin of the component (a) has a glass transition temperature of 20° C. or less, the adhesive layer is kept from being too hard, and the effect of increasing the adhesion is excellent.

When the isocyanate compound of the component (b) contains 3 or more isocyanate groups per molecule, excellent adhesion and solvent resistance are obtained in the adhesive layer.

When the thickness of the adhesive layer is 10 μm or more, the adhesive effect of the adhesive layer is enhanced.

When the photosensitive resin layer contains a water-dispersed latex, water developability can be imparted to the photosensitive resin layer.

When the isocyanate compound of the component (b) has an isocyanurate skeleton, the adhesion and solvent resistance of the adhesive layer are easily enhanced.

DESCRIPTION OF EMBODIMENTS

Next, the disclosure will be described in detail. In this specification, unless otherwise specified, the various physical properties are values at room temperature in the atmosphere.

(Outline of Flexographic Printing Original Plate)

Figure 1:
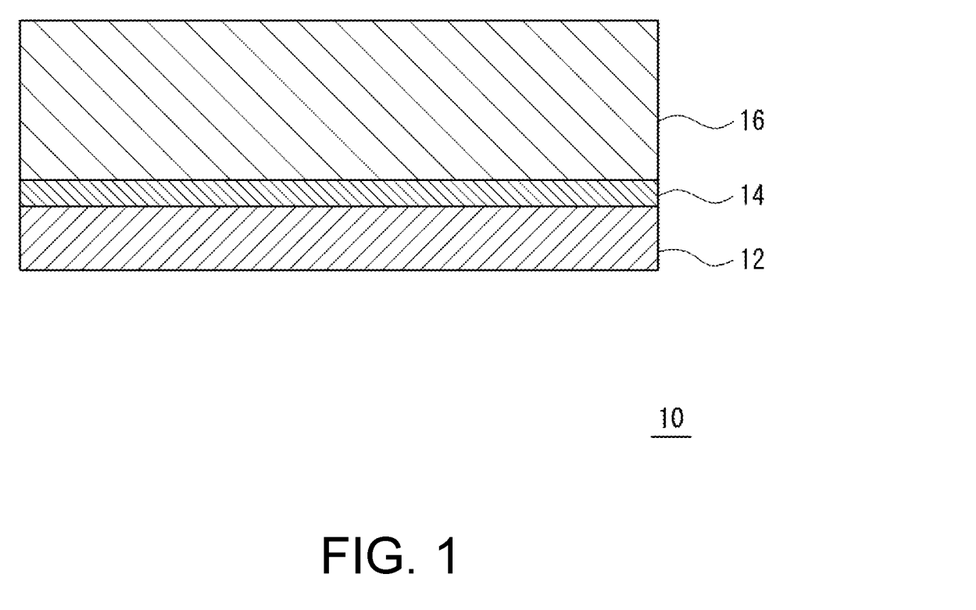
FIG. 1 is a cross-sectional view of a flexographic printing original plate according to an embodiment of the disclosure.

FIG. 1 is a cross-sectional view of a flexographic printing original plate according to an embodiment of the disclosure. As shown in FIG. 1, the flexographic printing original plate 10 according to an embodiment of the disclosure includes a supporting body 12, an adhesive layer 14, and a photosensitive resin layer 16. The adhesive layer 14 and the photosensitive resin layer 16 are laminated in this order on a surface of the supporting body 12. The adhesive layer 14 is provided in contact with the supporting body 12, and the photosensitive resin layer 16 is provided in contact with the adhesive layer 14.

The supporting body 12 supports layers such as the photosensitive resin layer 16 which are laminated thereon. The supporting body 12 contains a polyester resin, and is preferably composed of a polyester resin as a main component (contains 50% by mass or more of the whole). The supporting body 12 containing the polyester resin has excellent dimensional stability. Moreover, the supporting body 12 exhibits high adhesion to the adhesive layer 14 which will be described later. The type of the polyester resin that constitutes the supporting body 12 is not particularly limited, but aromatic polyester such as polyethylene terephthalate (PET), polybutylene terephthalate (PBT), polyethylene naphthalate (PEN), and polybutylene naphthalate (PBN) can be preferably used.

The supporting body 12 is preferably configured as a film body, and preferably has a thickness of 50 μm or more from the viewpoint of obtaining strength sufficient to support layers such as the photosensitive resin layer 16 laminated thereon. On the other hand, the thickness of the supporting body 12 is preferably 300 μm or less, more preferably 200 μm or less, from the viewpoint of ensuring high flexibility.

(Adhesive Layer)

The adhesive layer 14 functions to adhere the photosensitive resin layer 16 to the supporting body 12. The adhesive layer 14 contains the following components (a), (b), and (c).

(a) a polyester resin
(b) an isocyanate compound
(c) a xylene-based resin

The polyester resin of the component (a) functions as a binder resin in the adhesive layer 14. As the polyester resin of the component (a), for example, thermoplastic polyester known as a polyester-based adhesive and a polyester-based binder can be preferably used. The polyester resin may be saturated or unsaturated polyester.

Specific copolymerization components in the polyester resin are not particularly limited, but as an acid component, isophthalic acid, terephthalic acid, 2,6-naphthalenedicarboxylic acid, 5-sodium sulfoisophthalic acid, oxalic acid, succinic acid, adipic acid, suberic acid, sebacic acid, azelaic acid, dodecanedioic acid, dimer acid, maleic anhydride, maleic acid, fumaric acid, itaconic acid, citraconic acid, mesaconic acid, dicarboxylic acid such as cyclohexanedicarboxylic acid, 4-hydroxybenzoic acid, ε-caprolactone and lactic acid, etc. are included. In addition, as an alcohol component, ethylene glycol, diethylene glycol, 1,3-propanediol, neopentyl glycol, 1,6-hexanediol, cyclohexanedimethanol, triethylene glycol, polyethylene glycol, polypropylene glycol, polytetramethylene glycol, bisphenol A, bisphenol S and the alkyl oxide adducts thereof can be exemplified.

The polyester resin of the component (a) preferably has a glass transition temperature (Tg) of 20° C. or less. Then, since the hardness of the adhesive layer 14 is lowered, the adhesive force of the adhesive layer 14 can be particularly easily increased. Tg of the polyester resin is preferably 15° C. or less, and more preferably 10° C. or less. As the polyester resin, only one type may be used or two or more types may be used in combination.

The isocyanate compound of the component (b) functions as a crosslinking agent (curing agent) in the adhesive layer 14, and reacts with the terminal hydroxyl group and other functional groups possessed by the component (a) to form a crosslinked structure. As the isocyanate compound of the component (b), for example, a compound known as an isocyanate-based curing agent applicable to the polyester resin can be preferably used. Although the specific type of the isocyanate compound is not particularly limited, the number of isocyanate groups contained in one molecule is preferably two or more (difunctional or more), particularly three or more (trifunctional or more). By using a trifunctional isocyanate compound or more, the crosslinking density is increased, and the adhesion and solvent resistance of the adhesive layer 14 are easily improved. Particularly preferably, an isocyanate compound having an isocyanurate skeleton is used. Only one type or two or more types of isocyanate compounds may be used in combination.

Although the content of the isocyanate compound in the adhesive layer 14 is not particularly limited, the content is preferably 1 part by mass or more with respect to 100 parts by mass of the component (a) from the viewpoint of increasing the crosslinking density and solvent resistance. On the other hand, from the viewpoint of suppressing excessive curing of the adhesive layer 14, the content is preferably 15 parts by mass or less.

The xylene-based resin of the compound (c) functions as a tackifier in the adhesive layer 14 and increases the adhesion and solvent resistance of the adhesive layer 14. The xylene-based resin is a polymer having a skeleton composed of a condensate obtained by condensing m-xylene and formaldehyde in the presence of an acid catalyst (including a polymer with a low degree of polymerization such as oligomer). The xylene-based resin used as the component (c) in this embodiment has a melting point or softening point of 100° C. or less. Since the xylene-based resin of the component (c) has a melting point or softening point of 100° C. or less, the effect of improving the adhesion and solvent resistance of the adhesive layer 14 is well achieved. Although the mechanism by which the xylene-based resin improves the adhesion and solvent resistance of the adhesive layer 14 is not clear, by using the xylene-based resin having a melting point or softening point of 100° C. or less, the flexibility of the adhesive layer 14 is increased, and the effect of improving the adhesion is particularly excellent.

The xylene-based resin of the component (c) preferably has a hydroxyl group. Particularly, the xylene-based resin preferably has a hydroxyl group at the terminal of the skeleton composed of a condensate of m-xylene and formaldehyde. Since the xylene-based resin has a hydroxyl group, the effect of improving the adhesion and solvent resistance of the adhesive layer 14 is particularly increased. It is believed that this is because the xylene-based resin of the component (c) reacts with the isocyanate compound of the component (b) at the hydroxyl group to form a crosslinked structure. Then, a structure in which the component (a) and the compound (c) are both crosslinked by the component (b) is formed in the adhesive layer 14. However, if the hydroxyl group possessed by the xylene-based resin is a phenolic hydroxyl group such as those introduced by phenol modification, it is difficult to effectively contribute to improving the adhesion and solvent resistance of the adhesive layer 14. Thus, the xylene-based resin preferably has no phenolic hydroxyl group and has an alcoholic hydroxyl group. Although the number of hydroxyl groups possessed by the xylene-based resin is not particularly limited, the xylene-based resin preferably has two or more hydroxyl groups in each molecular chain from the viewpoint of increasing the effect of improving the adhesion and solvent resistance. As the xylene-based resin, only one type may be used or two or more types may be used in combination.

The content of the xylene-based resin of the component (c) in the adhesive layer 14 is preferably 5 parts by mass or more, more preferably 10 parts by mass or more, or 15 parts by mass or more, based on 100 parts by mass of the polyester resin of the component (a). Then, the effect of increasing the adhesion and solvent resistance of the adhesive layer 14 increases. On the other hand, the content of the component (c) is preferably 30 parts by mass or less, more preferably 25 parts by mass or less, based on 100 parts by mass of the component (a). Then, softening of the adhesive layer 14 due to containing a large amount of xylene-based resin is avoided, and the component (c) is likely to effectively contribute to improving the adhesion of the adhesive layer 14.

The adhesive layer 14 may appropriately contain components other than the components (a), (b), and (c) as long as the adhesion and solvent resistance are not significantly impaired. Examples of such components include a plasticizer, an antioxidant, an ultraviolet absorber, a colorant, an inorganic filler, and the like.

Although the thickness of the adhesive layer 14 is not particularly limited, the thickness is preferably 10 μm or more, more preferably 15 μm or more. Then, the adhesion of the adhesive layer 14 is effectively exhibited for the adhesion between the supporting body 12 and the photosensitive resin layer 16. Besides, from the viewpoint of avoiding an excessive thickness of the adhesive layer 14, the thickness of the adhesive layer 14 is preferably kept to about 50 μm or less.

In the flexographic printing original plate 10 according to this embodiment, as described above, the adhesive layer 14 provided between the supporting body 12 and the photosensitive resin layer 16 contains (a) a polyester resin, (b) an isocyanate compound, and (c) a xylene-based resin having a melting point or softening point of 100° C. or less. Since the adhesive layer 14 contains (a) a polyester resin and (c) a xylene-based resin, the adhesive layer 14 exhibits high adhesion not only to the photosensitive resin layer 16 but also to the supporting body 12 containing a polyester resin. As a result, after a flexographic printing plate is formed from the flexographic printing original plate 10 and fixed to a plate cylinder for use, the state in which the photosensitive resin layer 16 is adhered to the supporting body 12 can be stably maintained even when the flexographic printing plate is peeled off from the plate cylinder. Furthermore, the adhesive layer 14 exhibits high solvent resistance, and can maintain high adhesion even when the solvent contained in the ink used for printing contacts the adhesive layer 14.

The high adhesion and solvent resistance of the adhesive layer 14 result from the fact that the adhesive layer 14 contains the xylene-based resin of the component (c) as a tackifier. As described above, particularly when the xylene-based resin has a hydroxyl group, the effect of improving the adhesion and solvent resistance is excellent. In general, other types of tackifiers such as tackifiers using a petroleum resin and tackifiers using a rosin are known, but as shown in the later examples, when these other types of tackifiers are used, the adhesive layer 14 does not exhibit the effect of improving adhesion and solvent resistance as in the case of using the xylene-based resin.

(Photosensitive Resin Layer)

The photosensitive resin layer 16 is composed of a photosensitive resin composition containing a binder polymer, a photopolymerizable unsaturated compound, and a photopolymerization initiator. Since the photosensitive resin layer 16 contains a photopolymerizable unsaturated compound, the photosensitive resin layer 16 is cured by light (ultraviolet light).

The binder polymer of the photosensitive resin layer 16 preferably contains a hydrophilic water-dispersed latex together with a hydrophobic rubber from the viewpoint of water developability. The water-dispersed latex is obtained by dispersing polymer particles in water as a dispersoid. A polymer is obtained by removing water from this water-dispersed latex. The water-dispersed latex can impart water developability to the photosensitive resin layer 16.

The content of the water-dispersed latex is preferably in the range of 20 to 90% by mass with respect to the total mass of the hydrophobic rubber and the water-dispersed latex. The content is more preferably in the range of 30 to 80%, even more preferably in the range of 50 to 70%. When the water-dispersed latex is 20% by mass or more, the permeability of the water-based developer into the photosensitive resin layer 16 is high, so that the water developing speed is excellent. On the other hand, when the water-dispersed latex is 90% by mass or less, the image reproducibility is excellent.

As the water-dispersed latex, specifically, water-dispersed latex polymers such as polybutadiene latex, natural rubber latex, styrene-butadiene copolymer latex, acrylonitrile-butadiene copolymer latex, polychloroprene latex, polyisoprene latex, polyurethane latex, methyl methacrylate-butadiene copolymer latex, vinylpyridine polymer latex, butyl polymer latex, thiocol polymer latex, and acrylate polymer latex, and polymers obtained by copolymerizing these polymers with other components such as acrylic acid and methacrylic acid can be used. These may be used alone or two or more types may be used in combination.

The hydrophobic rubber can increase the rubber elasticity of the photosensitive resin layer 16. Thus, for example, the effect of facilitating printing on various printing materials can be expected. As the hydrophobic rubber, specifically, butadiene rubber (BR), nitrile rubber (NBR), acrylic rubber, epichlorohydrin rubber, urethane rubber, isoprene rubber, styrene isoprene rubber, styrene butadiene rubber, ethylene-propylene copolymer, chlorinated polyethylene, styrene-butadiene-styrene (SBS), styrene-isoprene-styrene (SIS), etc. can be used. In addition, among these rubbers, partial or complete hydrogenation products of those having unsaturated bonds can also be used. These may be used alone or two or more types may be used in combination. Among these, from the viewpoint of achieving an excellent balance between the water developability and the drying property of the photosensitive resin layer 16 when used in combination with the water-dispersed latex, butadiene rubber (BR) and nitrile rubber (NBR) are preferred.

The photopolymerizable unsaturated compound can cure the photosensitive resin layer 16 with light (ultraviolet light). The content of the photopolymerizable unsaturated compound is preferably in the range of 10 to 80% by mass, more preferably in the range of 20 to 50% by mass. If the content of the photopolymerizable unsaturated compound is 10% by mass or more, proper image reproducibility and ink solvent resistance can be obtained without insufficient cross-linking density. On the other hand, if the content of the photopolymerizable unsaturated compound is 80% by mass or less, the relief is not brittle and the flexibility characteristic of the flexographic printing plate can be ensured.

As the photopolymerizable unsaturated compound, an ethylenically unsaturated compound can be used. As the ethylenically unsaturated compound, a (meth)acrylic monomer, a (meth)acrylic oligomer, a (meth)acrylic modified polymer, etc. can be used. As the (meth)acrylic modified polymer, a (meth)acrylic modified butadiene rubber and a (meth)acrylic modified nitrile rubber can be used.

The photopolymerization initiator is not particularly limited as long as the photopolymerization initiator initiates photopolymerization of the photopolymerizable unsaturated compound, and for example, photopolymerization initiators such as alkylphenones, acetophenones, benzoin ethers, benzophenones, thioxanthones, anthraquinones, benzyls, and biacetyls can be used. Specifically, for example, benzyl dimethyl ketal, 2-hydroxy-2-methyl-1-phenyl-propan-1-one, methyl-O-benzoyl benzoate, 1-hydroxycyclohexyl phenyl ketone, etc. can be used.

The content of the photopolymerization initiator is preferably in the range of 0.3 to 10% by mass, more preferably in the range of 0.5 to 8% by mass. If the content of the photopolymerization initiator is 0.3% by mass or more, the photopolymerization reaction of the photopolymerizable unsaturated compound occurs sufficiently, and good images can be formed. On the other hand, if the content of the photopolymerization initiator is 5% by mass or less, the sensitivity is not too high, so it is easy to adjust the exposure time.

The photosensitive resin layer 16 may contain various additives in addition to these components. As such additives, a surfactant, a plasticizer, a thermal polymerization inhibitor (stabilizer), an ultraviolet absorber, a dye, a pigment, an antifoaming agent, a fragrance, etc. can be used.

The surfactant can improve the water developability of the photosensitive resin layer 16. The content of the surfactant is preferably in the range of 0.1 to 20% by mass as a ratio to the total mass of the water-dispersed latex, the hydrophobic rubber, and the surfactant. The content is more preferably in the range of 0.1 to 15%, even more preferably in the range of 0.1 to 10%. When the content of the surfactant is 0.1% or more, the permeability of the aqueous developer into the photosensitive resin layer 16 is increased, and the water developing speed is excellent. On the other hand, when the content of the surfactant is 20% by mass or less, the drying property is also excellent.

As the surfactant, a cationic surfactant, an anionic surfactant, and a nonionic surfactant can be used. Among the surfactants, an anionic surfactant is particularly preferred.

The plasticizer can impart flexibility to the photosensitive resin layer 16. Further, as a result of imparting flexibility to the photosensitive resin layer 16 and reducing hardness, the content of the photopolymerizable unsaturated compound can be increased, so that the effect of improving the ink solvent resistance can also be achieved. The content of the plasticizer is preferably in the range of 0.1 to 30% by mass, more preferably in the range of 5 to 20% by mass. If the content of the plasticizer is 0.1% by mass or more, the effect of imparting flexibility to the photosensitive resin layer 16 is excellent. Thus, the resistance of the photosensitive resin layer 16 to solvent ink (solvent ink swelling resistance) is improved. On the other hand, if the content of the plasticizer is 30% by mass or less, the strength of the photosensitive resin layer 16 can be ensured.

As the plasticizer, a liquid rubber, an oil, a polyester, a phosphoric acid-based compound, etc. can be used. Particularly, a plasticizer having good compatibility with the water-dispersed latex or hydrophobic rubber is preferred. As the liquid rubber, for example, liquid polybutadiene, liquid polyisoprene, or rubbers obtained by modifying these with maleic acid or an epoxy group can be used. As the oil, paraffins, naphthenes, aromas, etc. can be used. As the polyester, an adipic acid-based polyester, etc. can be used. As the phosphoric acid-based compound, phosphate ester, etc. can be used.

The thermal polymerization inhibitor (stabilizer) can improve thermal stability during kneading or improve storage stability. As the thermal polymerization inhibitor, phenols, hydroquinones, catechols, etc. can be used. The content of the thermal polymerization inhibitor is generally in the range of 0.001 to 5% by mass.

The photosensitive resin layer 16 is preferably composed of a softer material. From this viewpoint, the photosensitive resin layer 16 preferably contains a water-dispersed latex, a hydrophobic rubber, a surfactant, a photopolymerizable unsaturated compound, and a photopolymerization initiator. Moreover, it is preferable to further contain a plasticizer.

The thickness of the photosensitive resin layer 16 is preferably in the range of 0.01 to 10 mm. If the thickness of the photosensitive resin layer 16 is 0.01 mm or more, a sufficient depth of relief can be ensured. On the other hand, if the thickness of the photosensitive resin layer 16 is 10 mm or less, the weight of the flexographic printing original plate 10 can be suppressed, and practically it becomes easy to be used as a printing plate. The thickness of the photosensitive resin layer 16 is more preferably in the range of 0.1 to 5 mm, even more preferably in the range
(Other Layers)

The flexographic printing original plate 10 according to the disclosure may be a flexographic printing original plate of a so-called analog system in which a negative film (on which an image has already been formed) is brought into close contact onto the photosensitive resin layer 16 during use, or may be a flexographic printing original plate of a LAM (Laser ablation mask) system included in a so-called CTP (Computer to plate) system in which an infrared ablation layer is in close contact on the photosensitive resin layer 16 in advance.

The analog flexographic printing original plate includes a supporting body 12, an adhesive layer 14, and a photosensitive resin layer 16, as shown in FIG. 1. A protective layer may be provided on the photosensitive resin layer 16. The protective layer prevents damage to the photosensitive resin layer 16 before use. When the analog flexographic printing original plate is used, the protective layer is peeled off, and a negative film on which an image is formed in advance is brought into close contact onto the photosensitive resin layer 16.

The LAM flexographic printing original plate differs from the analog flexographic printing original plate in that the LAM flexographic printing original plate further has an infrared ablation layer on the photosensitive resin layer 16. That is, the LAM flexographic printing original plate includes a supporting body 12, an adhesive layer 14, a photosensitive resin layer 16, and an infrared ablation layer. A protective layer may be provided on the infrared ablation layer. The protective layer prevents damage to the infrared ablation layer before use. When the LAM flexographic printing original plate is used, the protective layer is peeled off to expose the infrared ablation layer. The infrared ablation layer is composed of a binder polymer and a resin composition containing an infrared absorbing substance. The infrared absorbing substance is a substance capable of absorbing infrared rays and converting infrared rays into heat, and it is preferable to use carbon black, carbon graphite, and the like.

In both the analog flexographic printing original plate and the LAM flexographic printing original plate, the protective layer is peeled off during use, and thus the protective layer preferably has excellent releasability. From this viewpoint, the protective layer is preferably a film made of a resin. Specifically, a polyester film such as a PET film, a polycarbonate film, a polyamide film, a polyethylene film, a polyolefin film such as a polypropylene film, a polystyrene film, etc. can be used.

The thickness of the protective layer is preferably in the range of 25 to 200 μm from the viewpoints of excellent handleability and excellent protection against scratches. The thickness is more preferably in the range of 50 to 150 μm. A release agent such as a silicone resin may be applied to the protective layer.

(Manufacturing Method of Flexographic Printing Original Plate)

The flexographic printing original plate 10 according to this embodiment can be manufactured by forming an adhesive layer 14 on a surface of a supporting body 12 and further bonding a photosensitive resin layer 16 to the surface together with a protective layer and an infrared ablation layer as appropriate.

The adhesive layer 14 can be formed by preparing an adhesive layer coating solution containing the components (a), (b), and (c) and a solvent, applying the same to the supporting body 12, and then drying it to remove the solvent. As the solvent, a ketone solvent such as methyl isobutyl ketone and methyl ethyl ketone, an aromatic solvent such as toluene and xylene, an alcohol-based solvent such as methanol and isopropyl alcohol, an ester-based solvent such as methyl acetate, a glycol solvent, an aprotic polar solvent such as N-methylpyrrolidone, etc. can be used. These may be used alone or two or more types may be used in combination.

The photosensitive resin composition of the photosensitive resin layer 16 can be prepared by dehydrating while kneading the components. Alternatively, the photosensitive resin composition can be prepared by preliminarily dehydrating the water-dispersed latex and then kneading the polymer obtained from the water-dispersed latex with other components.

The infrared ablation layer can be formed by dissolving each component of the resin composition forming the infrared ablation layer in a solvent to prepare a coating solution, applying this to a protective layer that serves as a base material, and then drying it to remove the solvent. An analog flexographic printing original plate can be manufactured by sandwiching the photosensitive resin composition between the adhesive layer 14 of a laminate composed of the supporting body 12 and the adhesive layer 14 and the protective layer, and pressing the photosensitive resin composition to a predetermined thickness. A LAM flexographic printing original plate can be manufactured by sandwiching the photosensitive resin composition between the adhesive layer 14 of a laminate composed of the supporting body 12 and the adhesive layer 14 and the infrared ablation layer of a laminate composed of the protective layer and the infrared ablation layer, and pressing the photosensitive resin composition to a predetermined thickness.

(Manufacturing Method of Flexographic Printing Plate)

Figure 2:
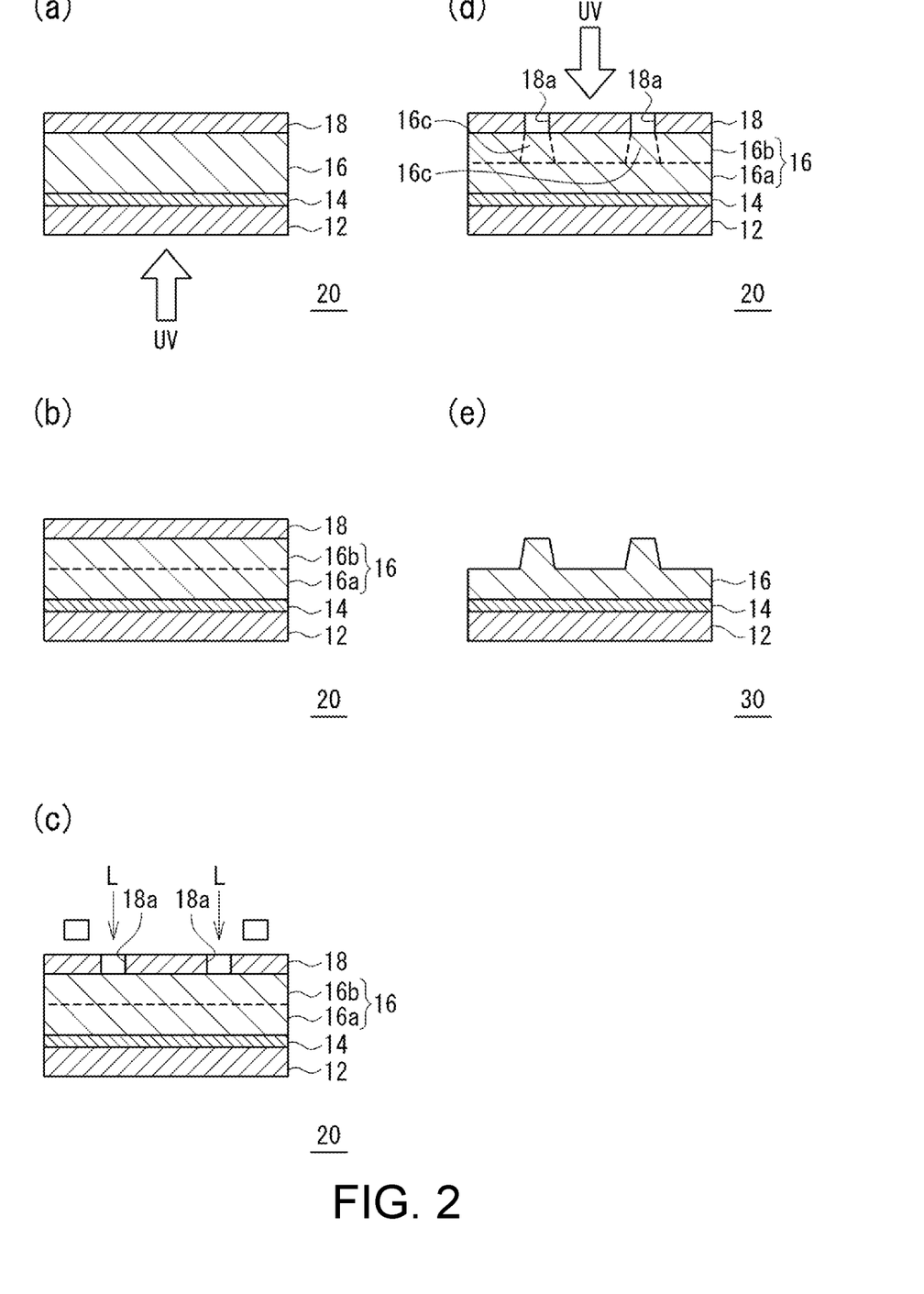
FIG. 2 provides cross-sectional views showing processes of manufacturing a flexographic printing plate from a flexographic printing original plate.

Next, a method of manufacturing a flexographic printing plate using a flexographic printing original plate will be described. FIG. 2 provides views illustrating processes of manufacturing a flexographic printing plate from a flexographic printing original plate. The flexographic printing original plate 20 shown in FIG. 2 is a LAM flexographic printing original plate, and further includes an infrared ablation layer 18 in addition to the flexographic printing original plate 10 shown in FIG. 1. The flexographic printing plate 30 is obtained by forming a relief image on the photosensitive resin layer 16 of the flexographic printing original plate 20.

The processes of manufacturing the flexographic printing plate 30 includes a back exposure process, a drawing process, a main exposure process, and a development process. The processes are basically performed in this order, but the back exposure process and the drawing process may be reversed in order.

In the back exposure process, as shown in (a) of FIG. 2, the flexographic printing original plate 20 is irradiated with ultraviolet rays from the side of the supporting body 12. Thus, as shown in (b) of FIG. 2, the lower side 16a of the photosensitive resin layer 16 is cured to form a so-called floor for a relief image.

In the drawing process, as shown in (c) of FIG. 2, the flexographic printing original plate 20 is irradiated with an infrared laser from the side of the infrared ablation layer 18 to remove a predetermined portion 18a of the infrared ablation layer 18, thereby creating a desired negative pattern on the photosensitive resin layer 16. A desired image mask is thus formed on the photosensitive resin layer 16. In the case of an analog flexographic printing plate, a process of bringing a negative film into close contact with the surface of the photosensitive resin layer 16 may be performed instead of this drawing process.

In the main exposure process, as shown in (d) of FIG. 2, the photosensitive resin layer 16 is irradiated with ultraviolet rays from above the image mask. Thus, a portion 16c not covered with the image mask on the upper side 16b of the photosensitive resin layer 16 is cured. The photosensitive resin layer 16 has cured portions 16a and 16c and an uncured portion (a portion of 16b excluding 16c).

In the development process, the image mask and the uncured portion of the photosensitive resin layer 16 (the portion of 16b excluding 16c) are removed in a developer. Thus, the flexographic printing plate 30 having a relief image formed thereon is obtained as shown in (e) of FIG. 2. A water-based developer is preferably used as the developer. Thereafter, if necessary, a drying process of drying the flexographic printing plate 30 or a post-exposure process of irradiating the entire dried flexographic printing plate 30 with ultraviolet rays again may be performed.

EXAMPLE

The disclosure will be specifically described below with reference to examples. The disclosure is not limited to these. In this example, unless otherwise specified, each process in sample preparation and evaluation was performed at room temperature in the atmosphere.
[Preparation of Sample]
<Formation of Adhesive Layer>

As the adhesive layer of the sample according to each example and comparative example, an adhesive layer coating solution was prepared by adding each component listed in Tables 1 and 2 to a mixed solvent obtained by mixing methyl ethyl ketone and toluene at a mass ratio of 1:1 so that the solid content was 30% by mass, and stirring with a vane. The obtained adhesive layer coating solution was applied to a supporting body composed of a PET film having a thickness of 125 μm by bar coating and dried at 120° C. for 10 minutes so that the adhesive layer thickness shown in Tables 1 and 2 was obtained after drying, thereby forming an adhesive layer on the supporting body.

The raw materials used for preparing the adhesive layer coating solution are as follows. Among the following, since the xylene-based resins 1 to 3 are highly viscous liquids at 25° C., the melting point is 25° C. or less.

Polyester resin 1: "VYLON 30SS" manufactured by TOYOBO CO., LTD. (Tg=7° C.)
Polyester resin 2: "Elitel UE-9300" manufactured by UNITIKA LTD. (Tg=11° C.)
Polyester resin 3: "Elitel UE-9100" manufactured by UNITIKA LTD. (Tg=18° C.)
Polyester resin 4: "Elitel UE-3350" manufactured by UNITIKA LTD. (Tg=52° C.)
Isocyanate 1: "DURANATE TPA100" (trifunctional) manufactured by Asahi Kasei Corporation
Isocyanate 2: "Hexamethylene diisocyanate" (bifunctional) manufactured by Tokyo Chemical Industry Co., Ltd.
Xylene-based resin 1: "NIKANOL H" manufactured by Fudow Co., Ltd. (no hydroxyl group, highly viscous liquid at 25° C.)
Xylene-based resin 2: "NIKANOL L5" manufactured by Fudow Co., Ltd. (one alcoholic hydroxyl group per molecular chain, highly viscous liquid at 25° C.)
Xylene-based resin 3: "NIKANOL K-100" manufactured by Fudow Co., Ltd. (two alcoholic hydroxyl groups per molecular chain, highly viscous liquid at 25° C.)
Xylene-based resin 4: "NIKANOL HP-100" manufactured by Fudow Co., Ltd. (with phenolic hydroxyl group, softening point: 105 to 125° C.)
Petroleum resin: "Arkon P-90" manufactured by Arakawa Chemical Industries, Ltd.
Rosin-based resin: Harima Chemicals Group, Inc. "Haritac PH"
<Preparation of Photosensitive Resin Composition>

45.5 parts by mass of a water-dispersed latex (25 parts by mass of polymer as solid content), 15 parts by mass of acrylic modified liquid BR, and 5 parts by mass of an acrylic monomer were mixed, and water was evaporated for 2 hours in a dryer heated to 120° C. to obtain a mixture of the polymer obtained from the water-dispersed latex and a photopolymerizable unsaturated compound. This mixture, 30 parts by mass of BR, 4 parts by mass of a surfactant (3.2 parts by mass of polymer as solid content), and 15 parts by mass of a plasticizer were kneaded in a kneader for 45 minutes. Thereafter, 0.2 parts by mass of a thermal polymerization inhibitor and 1 part by mass of a photopolymerization initiator were put into the kneader and kneaded for 5 minutes to prepare a photosensitive resin composition.

The raw materials used for preparing the photosensitive resin composition are as follows.

Water-dispersed latex: polymer obtained from "Nipol LX111NF" manufactured by ZEON CORPORATION
BR: "Nipol BR1220" manufactured by ZEON CORPORATION
Acrylic modified liquid BR: "BAC-45" manufactured by OSAKA ORGANIC CHEMICAL INDUSTRY LTD.
Acrylic monomer: "1,9-nonanediol dimethacrylate" manufactured by NOF Corporation
Surfactant: "RapiSol A80" manufactured by NOF Corporation
Thermal polymerization inhibitor: MEHQ (hydroquinone monomethyl ether) manufactured by Seiko Chemical Co., Ltd.
Photopolymerization initiator: "Irgacure 651" manufactured by BASF Corporation
Plasticizer: "SUNPAR 110" manufactured by Japan Sun Oil Company, Ltd.
<Preparation of Flexographic Printing Original Plate>

The obtained photosensitive resin composition was sandwiched between the adhesive layer formed on the supporting body and a polyester film that has been subjected to a release treatment on one side as a protective layer, and pressed with a press machine heated to 120° C. so that the thickness of the photosensitive resin layer became 1.5 mm, thereby manufacturing a flexographic printing original plate with the supporting body, the adhesive layer, the photosensitive resin layer, and the protective layer laminated in this order.
<Preparation of Cured Body for Test>

An exposure device with fifteen 800 W chemical lamps arranged side by side was used to perform back exposure on each of the flexographic printing original plates prepared above for 10 seconds from the supporting body side. Then, exposure (main exposure) was performed for 6 minutes from the protective layer side. Thus, a cured body for test was obtained by curing the photosensitive resin layer of the flexographic printing original plate.
[Evaluation Method]
<Adhesion>

The cured body for test prepared above was punched into a 2 cm wide×10 cm long test piece, and a peel test was performed on the test piece with the protective layer peeled off. In the peel test, a peel tester was used to measure the peel force (unit: N/cm) when forcibly peeling between the supporting body and the adhesive layer along the length direction of the test piece. The measurement was performed at a test piece speed of 50 mm/min. in the direction of 180° C. The average value of the measured peel force over the entire length direction, excluding the portion where the peel force increased at the initial peeling stage, was recorded as the adhesive force.

In order to set the test piece on the peel tester, a case where exposing, which is an operation of peeling between the supporting body and the adhesive layer at the end of the test piece, could not be performed and the peel test could not be performed was rated as "A", which indicated that the adhesion was extremely high. A case where the adhesive force measured in the peel test was 5 N/cm or more was rated as "B", which indicated that the adhesion was particularly high. A case where the adhesive force measured in the peel test was 2 N/cm or more and less than 5 N/cm was rated as "C", which indicated that the adhesion was high. A case where the adhesive force measured in the peel test was less than 2 N/cm was rated as "D", which indicated that the adhesion was low.

<Solvent Resistance>

The cured body for test prepared above was punched into a 2 cm×2 cm test piece, and the test piece with the protective layer peeled off was immersed for 24 hours in a mixed solvent imitating an ink solvent containing propyl acetate and 1-propanol at a mass ratio of 30:70. By forcibly peeling the supporting body and the adhesive layer off from the test piece after immersion, the state of adhesion between the supporting body and the adhesive layer was confirmed to evaluate the solvent resistance.

A case where the photosensitive resin layer was destroyed when the supporting body and the adhesive layer were forcibly peeled off and the peeling could not be performed was evaluated as "A", which indicated that the solvent resistance was extremely high. A case where peeling progressed at the interface in some regions when the supporting body and the adhesive layer are forcibly peeled off but the photosensitive resin layer was destroyed as the peeling continued thereafter was evaluated as "B", which indicated that the solvent resistance was particularly high. A case where the adhesive layer was peeled off at the interface when the supporting body and the adhesive layer were forcibly peeled off but the resistance during peeling was strong was evaluated as "C", which indicated that the solvent resistance was high. A case where the supporting body and the adhesive layer were peeled off during solvent immersion and a case where the supporting body and the adhesive layer could be easily peeled off without any resistance at the interface when forcibly peeled off were evaluated as "D", which indicated that the solvent resistance was low.

[Evaluation Result]

In Tables 1 and 2 below, the composition and thickness of the adhesive layer are shown in the upper rows, and the evaluation results of adhesion and solvent resistance are shown in the lower rows, for the samples according to the examples and comparative examples. The composition of the adhesive layer indicates the content of each component in units of parts by mass. Examples 1 and 13, and Examples 2 and 20 are identical, respectively.

TABLE 1

| Component | | | Example | | | | | | | | | | | | | | | |
|---|---|---|---|---|---|---|---|---|---|---|---|---|---|---|---|---|---|---|
| | species | Property | 1 | 2 | 3 | 4 | 5 | 6 | 7 | 8 | 9 | 10 | 11 | 12 | 13 | 14 | 15 | 16 |
| Adhesive layer | Polyester resin 1 | Tg = 7° C. | 100 | 100 | 100 | 100 | | | | | | 100 | 100 | 100 | 100 | 100 | 100 | 100 |
| | Polyester resin 2 | Tg = 11° C. | | | | | 100 | 100 | | | | | | | | | | |
| | Polyester resin 3 | Tg = 18° C. | | | | | | | 100 | 100 | | | | | | | | |
| | Polyester resin 4 | Tg = 52° C. | | | | | | | | | 100 | | | | | | | |
| | Isocyanate 1 | Trifunctional | 7 | 7 | 7 | | 7 | 7 | 7 | 7 | 7 | 7 | 7 | 7 | 7 | 7 | 7 | 7 |
| | Isocyanate 2 | Bifunctional | | | | 7 | | | | | | | | | | | | |
| | Xylene-based resin 1 | No hydroxyl group Highly viscous liquid at 25° C. | 10 | | | 10 | 10 | | 10 | | | 1 | 3 | 5 | 10 | 20 | 30 | 40 |
| | Xylene-based resin 2 | One alcoholic hydroxyl group Highly viscous liquid at 25° C. | | 10 | | | | 10 | | 10 | 10 | | | | | | | |
| | Xylene-based resin 3 | Two alcoholic hydroxyl groups Highly viscous liquid at 25° C. | | | 10 | | | | | | | | | | | | | |
| | Xylene-based resin 4 | Phenolic hydroxyl group Softening point: 105 to 125° C. | | | | | | | | | | | | | | | | |
| | Petroleum resin | | | | | | | | | | | | | | | | | |
| | Rosin-based resin | | | | | | | | | | | | | | | | | |
| | Adhesive layer thickness (μm) | | 20 | 20 | 20 | 20 | 20 | 20 | 20 | 20 | 20 | 20 | 20 | 20 | 20 | 20 | 20 | 20 |
| Evaluation | Adhesion | | A | A | A | B | A | A | A | C | C | B | B | A | B | A | B | C |
| | Solvent resistance | | B | A | A | C | B | A | B | A | B | C | B | B | B | B | C | C |

TABLE 2

| | Component | | Example | | | | | | | | | | Comparative example | | | |
|---|---|---|---|---|---|---|---|---|---|---|---|---|---|---|---|---|
| | species | Property | 17 | 18 | 19 | 20 | 21 | 22 | 23 | 24 | 25 | 26 | 1 | 2 | 3 | 4 |
| Adhesive layer | Polyester resin 1 | Tg = 7° C. | 100 | 100 | 100 | 100 | 100 | 100 | 100 | 100 | 100 | 100 | 100 | 100 | 100 | 100 |
| | Polyester resin 2 | Tg = 11° C. | | | | | | | | | | | | | | |
| | Polyester resin 3 | Tg = 18° C. | | | | | | | | | | | | | | |
| | Polyester resin 4 | Tg = 52° C. | | | | | | | | | | | | | | |
| | Isocyanate 1 | Trifunctional | 7 | 7 | 7 | 7 | 7 | 7 | 7 | 7 | 7 | 7 | 7 | 7 | 7 | 7 |
| | Isocyanate 2 | Bifunctional | | | | | | | | | | | | | | |
| | Xylene-based resin 1 | No hydroxyl group Highly viscous liquid at 25° C. | | | | | | | | | | | | | | |
| | Xylene-based resin 2 | One alcoholic hydroxyl group Highly viscous liquid at 25° C. | 1 | 3 | 5 | 10 | 20 | 30 | 40 | 10 | 10 | 10 | | | | |
| | Xylene-based resin 3 | Two alcoholic hydroxyl groups Highly viscous liquid at 25° C. | | | | | | | | | | | | | | |
| | Xylene-based resin 4 | Phenolic hydroxyl group Softening point: 105 to 125° C. | | | | | | | | | | | | 10 | | |
| | Petroleum resin | | | | | | | | | | | | | | 10 | |
| | Rosin-based resin | | | | | | | | | | | | | | | 10 |
| | Adhesive layer thickness (μm) | | 20 | 20 | 20 | 20 | 20 | 20 | 20 | 15 | 10 | 5 | 20 | 20 | 20 | 20 |
| Evaluation | Adhesion | | C | B | B | A | A | A | C | A | B | C | D | D | D | D |
| | Solvent resistance | | C | A | A | A | A | A | C | A | A | C | B | D | D | D |

In each of Examples 1 to 26, the adhesive layer contains a polyester resin, an isocyanate compound, and a xylene-based resin having a melting point or softening point of 100° C. or less. High adhesion and solvent resistance (A to C) are obtained in each of these examples. On the other hand, in Comparative Example 1, in which the adhesive layer does not contain a xylene-based resin and other tackifiers, the adhesion is low (D). In Comparative Example 2, in which the adhesive layer contains a xylene-based resin and has a softening point over 100° C., the adhesion and solvent resistance are low (D). Furthermore, in Comparative Examples 3 and 4, in which the adhesive layer contains a petroleum resin or a rosin-based resin as a tackifier, the adhesion and solvent resistance are low (D). From these results, as in Examples 1 to 26, it can be seen that, by combining the adhesive layer with the polyester resin and the isocyanate compound and adding the xylene-based resin having a melting point or softening point of 100° C. or less, high adhesion can be obtained between the adhesive layer and the supporting body in the flexographic printing original plate, and solvent resistance that can maintain high adhesion even when in contact with a solvent can be obtained.

Next, Examples 1 to 26 are compared with each other. In Examples 1 to 9, the compounds used as the polyester resin, the isocyanate compound, and the xylene-based resin are different from one another. According to these, in Examples 1 to 3 and 5 to 8, in which a trifunctional isocyanate compound and a polyester resin having a Tg of 20° C. or less are used, extremely high adhesion is obtained (A). Furthermore, in Examples 2, 3, 6, and 8, in which a xylene-based resin having an alcoholic hydroxyl group is used, extremely high solvent resistance is obtained (A). From these, it can be said that, from the viewpoint of improving adhesion and solvent resistance, it is particularly preferable to use a polyester resin having a Tg of 20° C. or less, an isocyanate compound having a functionality of 3 or more, and a xylene-based resin having an alcoholic hydroxyl group.

The set of Samples 10 to 16 and the set of Samples 17 to 23 respectively differ from one another in the content of the xylene-based resin in the adhesive layer. According to these, it can be said that high adhesion and solvent resistance can be obtained by setting the content of the xylene-based resin to 3 parts by mass or more and 30 parts by mass or less with respect to 100 parts by mass of the polyester resin. In particular, the content thereof is preferably 10 parts by mass or more.

In Examples 20 and 24 to 26, the thickness of the adhesive layer differs from one another. According to these, it can be said that high adhesion and solvent resistance can be obtained when the thickness of the adhesive layer is 10 μm or more. In particular, the thickness of the adhesive layer is preferably 15 μm or more.

Although the embodiments of the disclosure have been described in detail above, the disclosure is by no means limited to the above-described embodiments, and it is possible to make various modifications without departing from the gist of the disclosure.

What is claimed is:

1. A flexographic printing original plate, sequentially comprising a photosensitive resin layer and an adhesive layer on a surface of a supporting body,
   wherein the supporting body contains a polyester resin, and
   the adhesive layer contains the following components (a), (b), and (c):
   (a) a polyester resin
   (b) a trifunctional isocyanate compound having an isocyanurate skeleton
   (c) 10 parts by mass or more and 30 parts by mass or less of a xylene-based resin with respect to 100 parts by mass of the component (a), wherein the xylene-based resin has a melting point of 25° C. or less, and the xylene-based resin does not have a phenolic hydroxyl group and has an alcoholic hydroxyl group, wherein the polyester resin of the component (a) has a glass transition temperature of 20° C. or less, and a range of a content ratio of the component (c) to the component (b) is between 0.4 and 4.3.

2. The flexographic printing original plate according to claim 1, wherein the xylene-based resin of the component (c) has one hydroxyl group per molecular chain.

3. The flexographic printing original plate according to claim 1, wherein the adhesive layer has a thickness of 10 μm or more.

4. The flexographic printing original plate according to claim 1, wherein the photosensitive resin layer contains a water-dispersed latex.

* * * * *